United States Patent [19]

Ochii et al.

[11] Patent Number: 4,535,255
[45] Date of Patent: Aug. 13, 1985

[54] POSITIVE FEEDBACK AMPLIFIER CIRCUITRY

[75] Inventors: Kiyofumi Ochii, Yokohama; Masami Masuda, Tokyo; Takeo Kondo, Yokosuka, all of Japan

[73] Assignee: Tokyo-Shibaura Denki Kabushiki Kaisha, Japan

[21] Appl. No.: 669,724

[22] Filed: Nov. 8, 1984

Related U.S. Application Data

[60] Continuation of Ser. No. 452,127, Dec. 22, 1982, abandoned, which is a division of Ser. No. 170,687, Jul. 21, 1980, Pat. No. 4,379,346.

[30] Foreign Application Priority Data

Jul. 26, 1979 [JP] Japan ................... 54-95526

[51] Int. Cl.³ ...................... H03K 5/01; H03K 19/094
[52] U.S. Cl. .................... 307/264; 307/584; 307/578; 307/562
[58] Field of Search .............. 307/548, 552, 553, 554, 307/448, 264, 268, 271, 575, 576, 584, 585, 546, 501, 562

[56] References Cited

U.S. PATENT DOCUMENTS

| T955,006 | 2/1977 | Cavaliere et al. | 307/585 |
| 3,657,568 | 4/1972 | Dargent | 307/585 |
| 3,845,328 | 10/1974 | Hollingsworth | 307/255 |
| 3,989,955 | 11/1976 | Suzuki | 307/481 |
| 4,071,783 | 1/1978 | Knepper | 307/246 |
| 4,080,539 | 3/1978 | Stewart | 307/264 |
| 4,158,149 | 6/1979 | Otofuji | 307/571 |
| 4,317,055 | 2/1982 | Yoshida et al. | 307/584 |
| 4,345,172 | 8/1982 | Kobayashi et al. | 307/448 |
| 4,387,308 | 6/1983 | Nagami | 307/264 |

OTHER PUBLICATIONS

Cranford, "Dynamic Depletion Circuits Upgrade MOS Performance", Electronics, vol. 54, No. 13, 6/30/81, pp. 128-129.

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

A positive feedback amplifier circuit for possible use with a semiconductor memory device includes first and second MOS transistors whose current paths are connected together between two power source terminals, the gate of the first MOS transistor being connected to a clock. A third MOS transistor has a current path connected between one of the power source terminals and the gate of the second MOS transistor and also has a gate connected to the junction between the first and second MOS transistors and to a resistive means whose other end is connected to one of the power source terminals.

5 Claims, 10 Drawing Figures

POSITIVE FEEDBACK AMPLIFIER CIRCUITRY

This application is a continuation of Ser. No. 452,127, filed Dec. 22, 1982, now abandoned, which is a division of application Ser. No. 170,687, filed July 21, 1980, now U.S. Pat. No. 4,379,346.

BACKGROUND OF THE INVENTION

The present invention relates to a semiconductor memory device and to an amplifier which can be used with such a device.

Generally, a semiconductor memory device is provided with memory elements formed of insulated gate field effect transistors (MOS FETs). A semiconductor memory can either be a dynamic memory device or a static memory device. The dynamic memory device is suitable for high density integrated circuit fabrication, while the static memory device is suitable as a high speed memory device because of less restriction on timing for its operation.

From a viewpoint of the semiconductor manufacturing technology, MOS memory is classified into metal gate MOS memory devices formed of metal gate MOS transistors using metal gate electrodes with extremely small sheet resistance, and silicon gate MOS memory devices formed of silicon gate MOS FETs having gates made of polysilicon with a higher sheet resistance than that of the metal. The metal gate MOS memory does not use the polysilicon layer. For this reason, it needs fewer steps to manufacture, but it needs a relatively large area for wiring. On the other hand, the silicon gate MOS memory requires an additional step to form the polysilicon layer, resulting in complexity of the manufacturing process.

FIG. 1 shows a semiconductor memory device formed of silicon gate MOS memory elements. The semiconductor memory device includes a plurality of MOS memory cells MC-11 to MC-MN arranged in a matrix fashion, paired data lines D0-1 and D1-1, D0-2 and D1-2, . . . , and D0-N and D1-N, which are commonly connected to input and output terminals of the memory cells on the same column, and word lines W1 to WM each transferring an address signal for access to specified memory cells on the same row. Those word lines W1 to WM are connected to a row decoder 2 which receives a row address from an address signal generator (not shown) to selectively energize the word lines. The data lines D0-1 to D0-N and D1-1 to D1-N are connected to a column decoder/sense amplifier 4 which responds to a column designating signal from the address signal generator to selectively energize the data lines and supply the data read out from a desired memory cell to a data processor (not shown), by way of an I/O unit 6.

With the semiconductor memory device thus constructed as shown in FIG. 1, to execute a read operation, the row decoder 2 and the column decoder 4 respond to an address signal from an address signal generator (not shown) to selectively energize one of the word lines W1 to WM and one of pairs of the data lines D0-1 to D0-N and D1-1 to D1-N. Upon energization, the memory cells coupled with the word lines energized correspondingly produce the stored data. Of those data, only the data transferred to the pair of data lines selected by the column decoder/sense amplifier 4 is amplified by the sense amplifier 4 and then is transmitted to an I/O unit 6.

A data read time, from which is the instant that the row and column address signals are respectively supplied to the row decoder 2 and the column decoder 4 until the instant that the data read out of a desired memory cell is transferred to the I/O unit 6, depends on the setup time of the row decoder 2, the transfer time of the row address signal on the word line, the transfer time of the data on the data line, and the transfer time of the data from the sense amplifier 4 to the I/O unit 6. It should be noted here that the transfer time of the row address signal on the word line generally has the greatest influence upon the data read time, since the word line is formed of the polysilicon layer with a high sheet resistance, as previously stated. As a consequence, in constructing a high speed memory device, it is essential to minimize the transfer time of the row address signal on the word line thereby to reduce the over-all operation delay time.

Certain measures, such as one shown in FIG. 2, have successfully reduced the read operation delay to some extent. However, along with the recent demand on the speed-up of the memory speed, it is required to reduce the time delay in the readout operation even further.

Accordingly, an object of this invention is to provide a positive feedback amplifier for use with a semiconductor device to shorten the access time to memory cells.

SUMMARY OF THE INVENTION

According to one aspect of the present invention, there is provided a positive feedback amplifier circuit comprising: a clock receiving terminal for receiving the clock signal; first and second power source terminals; a first MOS transistor whose current path is connected at one end to the first power source terminal and whose gate is conected to the clock receiving terminal; a second MOS transistor wrose current path is connected between the other end of the current path of the first MOS transistor and the second power source terminal; a third MOS transistor whose current path is connected between the first power source terminal and the gate of the second MOS transistor and whose gate is connected to the junction between the first and second MOS transistors; and resistive means connected between the first power source terminal and the gate of the third MOS transistor.

The present invention will be better understood from the following description taken in connection with the accompanying drawings, in which:

DESCRIPTION OF THE PREFERRED EMBODIMENT

The present invention can be used with semiconductor devices since the resistance of the word line and a stray capacitance associated with the word line are substantially uniformly distributed and therefore the access time to a memory cell coupled with the word line at the farthest location from a row decoder is longest. From this fact, it is deduced that in order to reduce the access time for all the memory cells, it is effective to amplify the access signal on the word line at the farthest location from the row decoder and to positively feed back the amplified access signal to the word line.

Figure 3:
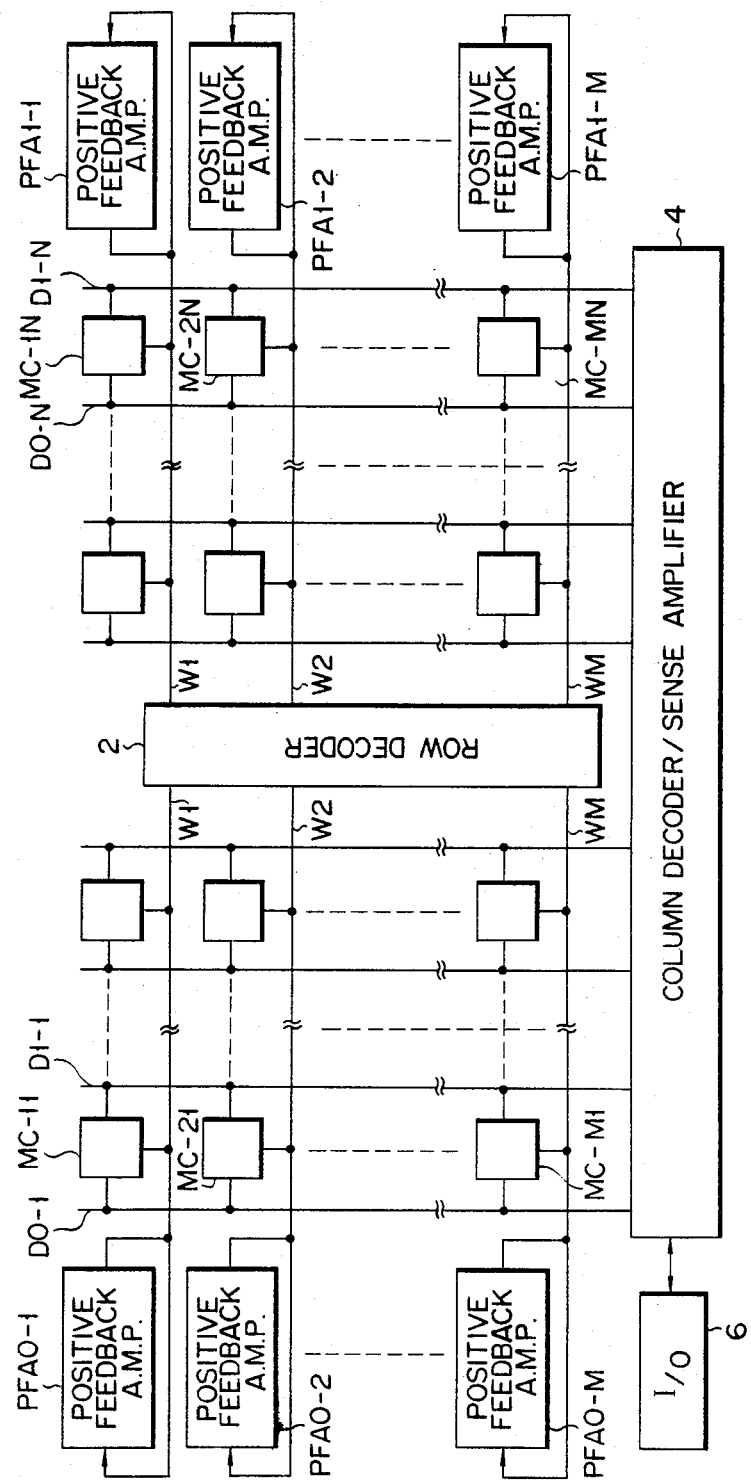
FIG. 3 is a block diagram of an embodiment of a semiconductor memory device according to the present invention.

FIG. 3 is a semiconductor as an embodiment of the technical idea of the invention based on the above fact.

The word lines W1 to WM are connected at both ends to positive feedback amplifiers PFA0-1 to PFA0-M and PFA1-1 to PFA1-M, respectively. These positive feedback amplifiers each have a construction as shown in FIG. 4.

Figure 4:
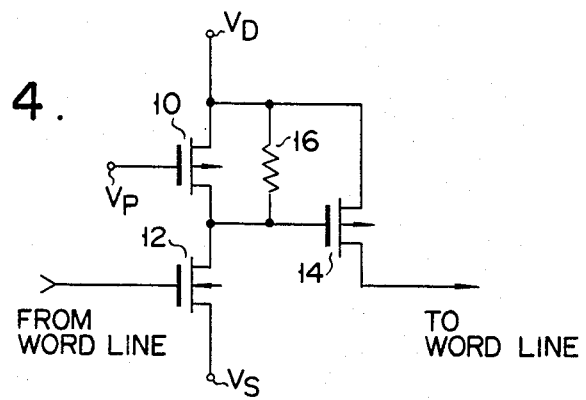
FIG. 4 is a circuit diagram of a positive feedback amplifier circuit which can be used for the semiconductor memory device shown in FIG. 3.

The positive feedback amplifier shown in FIG. 4 has a p-channel MOS FET having a source connected to a positive power source terminal $V_D$, an n-channel MOS FET having a source connected to a reference power source terminal Vs and a drain connected to the drain of the p-channel MOS FET 10, and a p-channel MOS FET 14 having a gate connected to the drains of the FETs 10 and 12 and a source connected to the positive power source terminal $V_D$. Further, a resistor 16 is connected in parallel with a current path of the MOS FET 10. The gate of the MOS FET 10 is coupled with a clock pulse receiving terminal Vp for receiving a low level clock pulse for a given period of time each time the memory operating cycle changes. The gate of the MOS FET 12 and the drain of the MOS FET 14 are connected to the same word line.

There will now be described the operation of the positive feedback amplifier shown in FIG. 4.

In response to clock pulses supplied to the clock receiving terminal Vp, MOS FET 10 is made conductive every memory cycle (that is, every time the address signal is changed) for a given period of time to precharge the drain of the MOS FET 12 to a high level. For example, when an access signal is applied to the word line and a potential on the word line exceeds the threshold voltage of the MOS FET 12, the MOS FET 12 conducts, so that the drain voltage of the MOS FET decreases toward a reference voltage. When the drain voltage of the MOS FET 12 reaches the threshold voltage of the MOS FET 14, the potential level of the word line is pulled up to a high level by way of the MOS FET 14 conducted.

Figure 5:
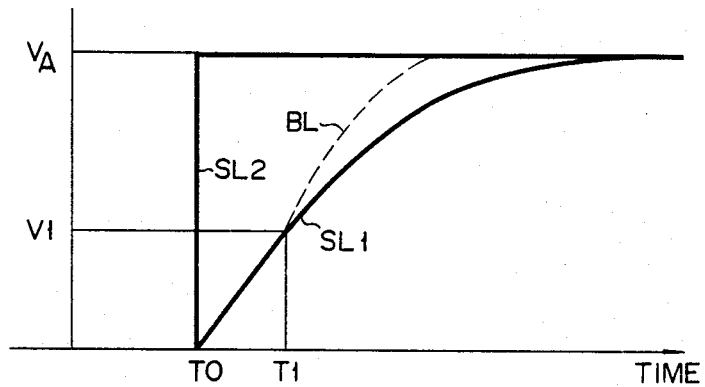
FIG. 5 is a graphical representation of a potential variation, at the time of access, on the word line of the semiconductor memory device according to the present invention and the conventional memory device of this type.

FIG. 5 illustrates the variation of the voltage level of an access signal with a voltage level $V_A$ on the word line when the access signal is produced on the word line at time To.

In FIG. 5, a solid line SL1 shows a voltage variation of the access signal on the portion of the word line at the farthest distance from the decoder 2 when the positive feedback amplifier is not used. Another solid line SL2 illustrates a voltage variation of the access signal on the portion of the word line near the decoder 2.

Figure 6:
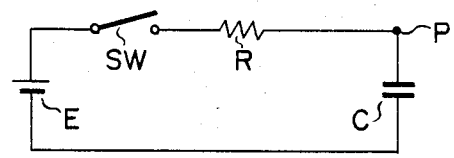
FIG. 6 is an equivalent circuit useful in explaining the potential variation characteristic shown in FIG. 5.

FIG. 6 shows an equivalent circuit of a word line segment ranging from the decoder 2 to the positive feedback amplifier. In the circuit, a battery E produces an output voltage $V_A$, and a resistor R and a capacitor C express the resistance and the stray capacitance of the word line segment in the lumped constant manner. When a switch SW in the circuit is closed at time To, a potential at a junction P between the resistor R and the capacitor C changes as indicated by the solid line SL1 in FIG. 5. A potential Vx of the access signal on the word line at time T, which is depicted by the line SL1, is mathematically given by the following equation:

$$V_x = V_A\{1 - e^{-(T-T_o)/CR}\}$$

At the time T1, when the voltage on the word line reaches the voltage level V1, the MOS FET 12 of the positive feedback amplifier shown in FIG. 6 is conductive and the MOS FET 14 also conducts. As a result, the voltage $V_D$ is coupled to the voltage Vx on the word line through MOS FET 14, and the potential at the corresponding portion of the word line steeply rises as indicated by a broken line BL in FIG. 5.

As described above, the positive feedback amplifier is coupled with the word line at a distance from the row decoder 2, whereby the voltage rise on the word line, due to the access signal, is made steep, and the access time to the memory cell located near the positive feedback amplifier is remarkably reduced.

Figure 7:
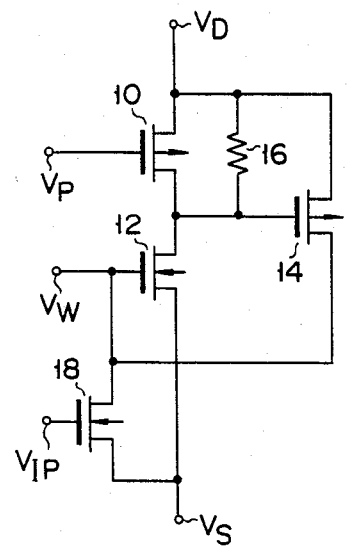
FIG. 7 shows a circuit diagram of a modification of the positive feedback amplifier circuit shown in FIG. 4.

FIG. 7 shows a modification of the positive feedback amplifier circuit shown in FIG. 4. The circuit is the same as that shown in FIG. 4 except that it has additionally an n-channel MOS FET 18 which has a drain coupled with a word line connecting terminal Vw connected to the word line, a source connected to the reference power source terminal Vs, and a gate connected to the clock pulse receiving terminal $V_{IP}$ for receiving clock pulses which are opposite in phase to the pulses applied to the gate of the MOS FET 10.

When the positive feedback amplifier circuit shown in FIG. 4 is used, the potential on the word line selected changes from high level to low as the row address designation period terminates. At a distance from the decoder 2, the potential change on the word line is slow. When the positive feedback amplifier circuit shown in FIG. 7 is used, a high level signal is applied to the clock pulse receiving terminal $V_{IP}$ as the low address designating period terminates. This renders the MOS FET 18 conductive and instantaneously reduces to the low level the potential at the word line connecting terminal Vw, that is, the potential on the portion of the word line coupled with the positive feedback amplifier. Thus, the use of the positive feedback amplifier circuit shown in FIG. 7 may quickly permit a potential change on the word line.

Figure 8:
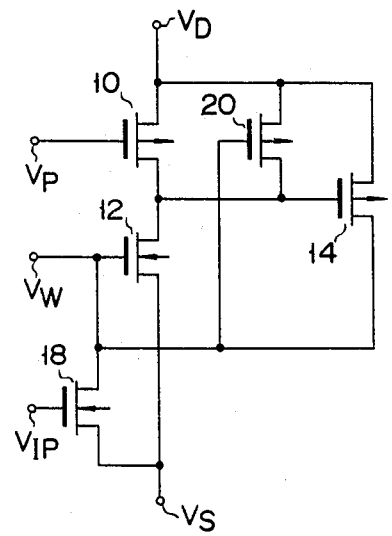
FIG. 8 is a circuit diagram of a modification of the positive feedback circuit shown in FIG. 7.

FIG. 8 shows a modification of the positive feedback amplifier circuit shown in FIG. 7. The circuit in FIG. 8 is similar to that of FIG. 7 except that a p-channel MOS FET 20 is used in place of the resistor 16. The source of the MOS FET 20 is coupled with the power source terminal $V_D$, the drain is connected to the gate of the MOS FET 14, and the gate is connected to the word line connecting terminal Vw.

In the circuit of FIG. 8, when a high level signal is applied to the word line connecting terminal Vw, the MOS FET 20 is rendered nonconductive to block the current flow from the power source terminal $V_D$ to the reference power source terminal Vs. In the circuit shown in FIG. 7 when a high level signal is applied to the word line connecting terminal Vw, a current flows from the power source terminal $V_D$ to the reference power source terminal Vs through the resistor 16 and the MOS FET 12 conducted. In this respect, the FIG. 8 circuit is superior to the one in FIG. 7.

While having been described by using some specific embodiments, the present invention may be changed and modified variously within the scope of the present invention.

Figure 9:
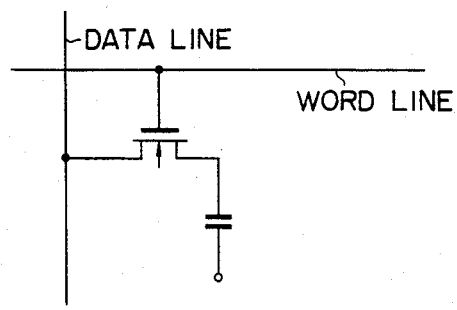
FIG. 9 shows another type of memory cell which can be used for the memory device according to the present invention.
Figure 10:
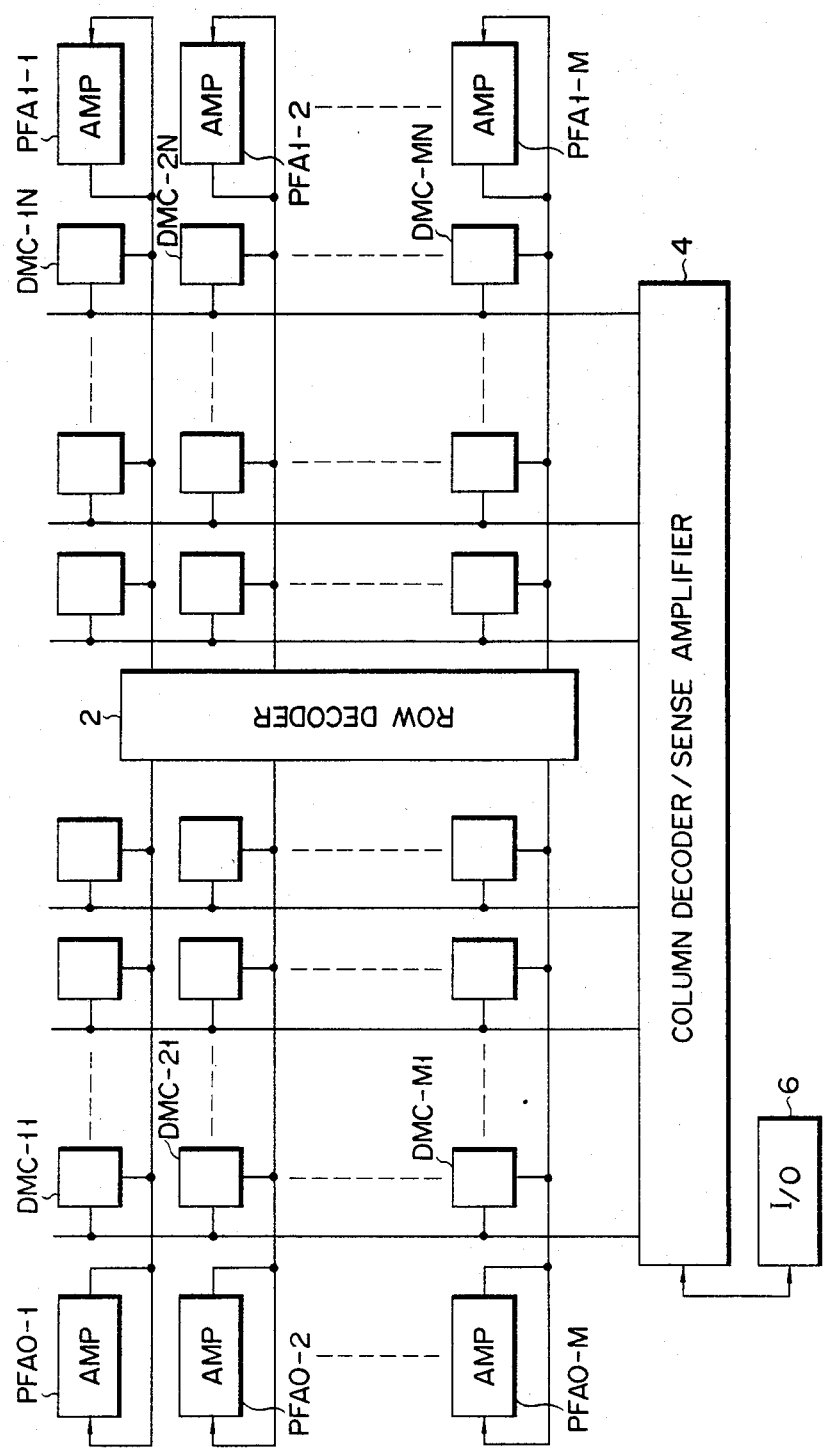
FIG. 10 is an arrangement of a semiconductor memory device constructed by using a plurality of memory cells with a similar construction to that of the memory cell shown in FIG. 9.

For example, the pairs of the word lines are used for the memory-cells on each column. The paired data lines may be substituted by a single data line if the dynamic memory cells as shown in FIG. 9 are used. FIG. 10 shows a matrix memory array having memory cells DMC-9 to DMC-MN each with a similar construction to that of the memory cell shown in FIG. 9. The FIG. 10 embodiment also has the useful effect like the FIG. 3 embodiment.

The positive feedback amplifier circuits, which are connected to both ends of the word lines in FIG. 3, may be connected to the word lines at the portion thereof far from the row decoder 2.

Figure 1:
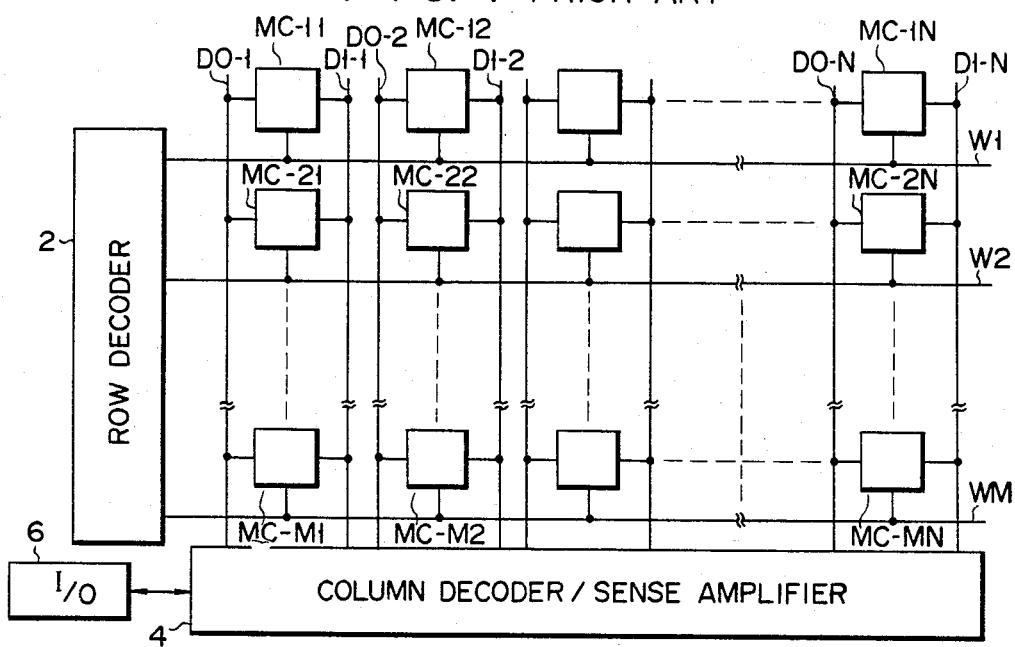
FIGS. 1 and 2 show arrangements of conventional semiconductor memory devices.
Figure 2:
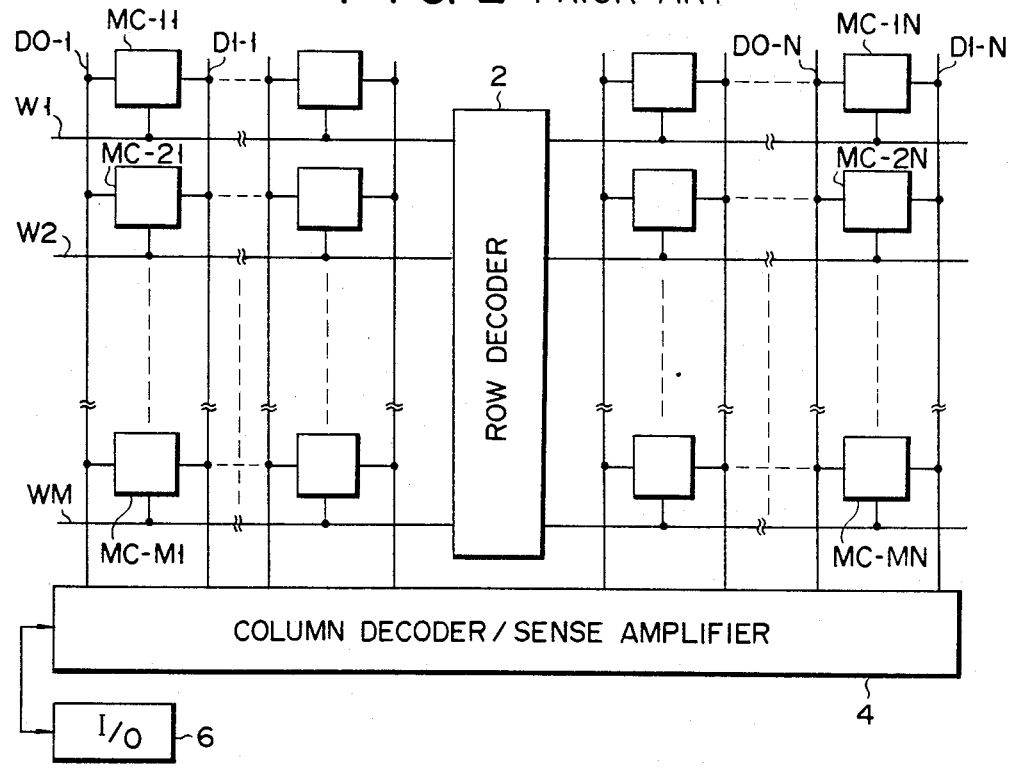

The decoder 2, which is disposed at the substantially central portion of the memory array in the embodiment shown in FIG. 3, may be disposed at other suitable location. In an extreme example, it may be connected to one end of the word lines, as shown in FIG. 1. In this case, the positive feedback circuit is connected at or near the other side of the word lines.

What we claim is:

1. A positive feedback amplifier circuit responsive to a clock signal and an I/O signal, said amplifier circuit comprising:

an I/O terminal receiving said I/O signal;
    a clock receiving terminal receiving said clock signal;
    first and second power source terminals;
    a first MOS transistor whose current path is connected at one end to said first power source terminal and whose gate is connected to said clock receiving terminal;
    a second MOS transistor whose current path is connected between the other end of said first MOS transistor's current path and said second power source terminal and whose gate is connected to said I/O terminal;
    a third MOS transistor whose current path is connected between said first power source terminal and the gate of said second MOS transistor and whose gate is connected to the junction between said first and second MOS transistors; and
    resistive means connected between said first power source terminal and the gate of said third MOS transistor.

2. A positive feedback amplifier circuit according to claim 1, wherein said second MOS transistor is of n-channel type and said first and third MOS transistors are of p-channel type.

3. A positive feedback amplifier circuit according to claim 1, wherein said amplifier is also responsive to a complementary clock signal which is out-of-phase with said clock signal at said clock receiving terminal, and further comprising a fourth MOS transistor whose current path is connected between said second power source terminal and the gate of said second MOS transistor and whose gate is connected to said complementary clock signal.

4. A positive feedback amplifier circuit according to claim 3, wherein said resistive means includes a fifth MOS transistor whose current path is connected between said first power source terminal and the gate of said third MOS transistor, and whose gate is connected to the gate of said second MOS transistor.

5. A positive feedback amplifier circuit according to claim 1, wherein said resistive means includes a fourth MOS transistor which has a current path connected between said first power source terminal and the gate of said third MOS transistor and a gate connected to the gate of said second MOS transistor.

* * * * *